United States Patent
Verardo et al.

(10) Patent No.: US 11,586,145 B2
(45) Date of Patent: Feb. 21, 2023

(54) COMPONENT ESPECIALLY FOR HOROLOGY WITH SURFACE TOPOLOGY AND METHOD FOR MANUFACTURING THE SAME

(71) Applicant: Nivarox-FAR S.A., Le Locle (CH)

(72) Inventors: Marco Verardo, Les Bois (CH); Christian Charbon, Chezard-St-Martin (CH)

(73) Assignee: Nivarox-FAR S.A., Le Locle (CH)

( * ) Notice: Subject to any disclaimer, the term of this patent is extended or adjusted under 35 U.S.C. 154(b) by 315 days.

(21) Appl. No.: 16/829,086

(22) Filed: Mar. 25, 2020

(65) Prior Publication Data
US 2020/0371477 A1 Nov. 26, 2020

(30) Foreign Application Priority Data

May 23, 2019 (EP) ..................................... 19176259

(51) Int. Cl.
*G04B 13/02* (2006.01)
*G04B 1/14* (2006.01)
(Continued)

(52) U.S. Cl.
CPC .......... *G04B 13/026* (2013.01); *G04B 1/145* (2013.01); *G04B 13/027* (2013.01); *G04B 15/14* (2013.01); *G04D 3/0087* (2013.01)

(58) Field of Classification Search
CPC .... G04B 13/026; G04B 1/145; G04B 13/027; G04B 15/14; G04D 3/0087
(Continued)

(56) References Cited

U.S. PATENT DOCUMENTS 11,262,707 B2 * 3/2022 Oliveira ................ G04B 13/02
2015/0309474 A1 10/2015 Bossart et al.
2016/0376147 A1 * 12/2016 Gandelhman .......... G04D 99/00
368/139

FOREIGN PATENT DOCUMENTS

CH 710 846 A2 9/2016
CH 710846 A2 * 9/2016 ............. G04B 15/14
(Continued)

OTHER PUBLICATIONS

Combined Chinese Office Action and Search Report dated Apr. 27, 2021 in Patent Application No. 202010441243.4 (with English language translation and English translation of Category of Cited Documents), 14 pages.

(Continued)

*Primary Examiner* — Edwin A. Leon
*Assistant Examiner* — Kevin Andrew Johnston
(74) *Attorney, Agent, or Firm* — Oblon, McClelland, Maier & Neustadt, L.L.P.

(57) ABSTRACT

A component intended to be in friction contact with another component, the component being coated with an electrically conductive layer in one piece, at least partially covering every surface of the component, the friction occurring on at least one of these surfaces, called the functional surface, the functional surface being surrounded by a plurality of side surfaces, the component having on its functional surface a texture formed of a succession of troughs coated with the electrically conductive layer, the troughs each extending between two side surfaces such that the electrically conductive layer remains in one piece over the component despite the wear caused by friction on the functional surface. The invention also relates to the method for manufacturing the component by the DRIE (deep reactive ion etching) process, (Continued)

wherein surface defects on the sides machined by the DRIE process are used to form the troughs.

16 Claims, 2 Drawing Sheets

(51) Int. Cl.
    *G04B 15/14*     (2006.01)
    *G04D 3/00*     (2006.01)

(58) Field of Classification Search
    USPC .......................................................... 368/124
    See application file for complete search history.

(56) References Cited

FOREIGN PATENT DOCUMENTS

| | | |
|---|---|---|
| CN | 1985333 A | 6/2007 |
| CN | 101042570 A | 9/2007 |
| CN | 101053074 A | 10/2007 |
| CN | 202719663 U | 2/2013 |
| EP | 1 837 722 A2 | 9/2007 |
| EP | 1837722 A2 * | 9/2007 ............... B81B 7/00 |
| EP | 2 937 311 A1 | 10/2015 |
| EP | 3 002 637 A1 | 4/2016 |
| EP | 3002637 A1 * | 4/2016 ........... G04B 13/022 |
| EP | 3 109 200 A1 | 12/2016 |
| JP | 2014051741 A * | 3/2014 |
| JP | 2017-90267 A | 5/2017 |
| JP | 2017090267 A * | 5/2017 |

OTHER PUBLICATIONS

European Search Report dated Nov. 13, 2019 in European Application 19176259.0 filed May 23, 2019 (with English Translation of Categories of Cited Documents), 4 pages.

\* cited by examiner (a)

(b)

(c)

(d)

COMPONENT ESPECIALLY FOR HOROLOGY WITH SURFACE TOPOLOGY AND METHOD FOR MANUFACTURING THE SAME

CROSS-REFERENCE TO RELATED APPLICATION

This application claims priority to European Patent Application No. 19176259.0 filed on May 23, 2019, the entire disclosure of which is hereby incorporated herein by reference.

FIELD OF THE INVENTION

The present invention relates to a micromechanical component, used, in particular, in the field of horology, intended to be subjected during use to friction contact with another component. It also relates to the method for manufacturing the item.

PRIOR ART

It is known to coat a micromechanical component with a functional layer intended to improve its tribology and make the surface conductive or resistant to wear. In the case of a conductive layer, the simplest solution is to deposit a metal layer, typically by PVD. This deposition is generally relatively soft and subject to wear in areas of friction, for example at the contact between an escape wheel tooth and a pallet stone or between a lever-notch and an impulse pin. The complete disappearance of this conductive layer from the friction area has the drawback of making the conductive layer discontinuous and therefore useless.

SUMMARY OF THE INVENTION

It is an object of the present invention to overcome the aforementioned drawback by proposing a component that is structured in the area intended to be subjected to friction, making it possible to maintain during use, despite wear, a continuous conductive layer between the friction area and the rest of the component.

To this end, in said area, also referred to as the functional surface, the component has a structure formed of a series of troughs coated with the conductive layer. The troughs or recessed portions coated with the conductive layer extend between two side surfaces surrounding the functional surface to form a layer communicating with the various surfaces of the component also coated with a conductive layer. During wear, the conductive layer remains at the bottom of the troughs which maintains the integrity and continuity of the layer.

Preferably, the structure is scalloped and produced during the step of machining the component. The manufacturing method used is the DRIE (deep reactive ion etching) process. This process causes scalloping or ripples to form on the etched edge of the component. This scalloping is an inherent defect of the process which those skilled in the art wish, according to prior art, to remove. To this end, the DRIE process is generally followed by an oxidation and deoxidation step intended to smooth out the scalloped profile. In contrast, according to the invention, this step is omitted to maintain the scalloped profile on the edge of the component. The manufacturing method according to the invention thus makes it possible, in a single step, to machine/etch the component and texture the surface. Next, the conductive layer is deposited on all the surfaces of the component. The coating on the various surfaces can be only partial, provided that it is in one piece or continuous on all the faces of the component to ensure the property of electrical conductivity across the entire component.

Other features and advantages of the present invention will appear in the following description of preferred embodiments, given by way of non-limiting example, with reference to the annexed drawings.

DETAILED DESCRIPTION

The present invention relates to a component intended to be subject to friction in use. More specifically, this is a component made of an electrically non-conductive material intended to be coated with a conductive layer in order to release the electrostatic charges accumulated during friction. For example, the material may be silicon-based. In the field of horology, for example, one can, for example, cite one component or both components involved in a system: escape wheel teeth/pallet stones, lever-notch/impulse pin, etc. It may also concern a balance spring intended to be fitted to a fixed inertia balance of a timepiece movement.

Figure 1A:
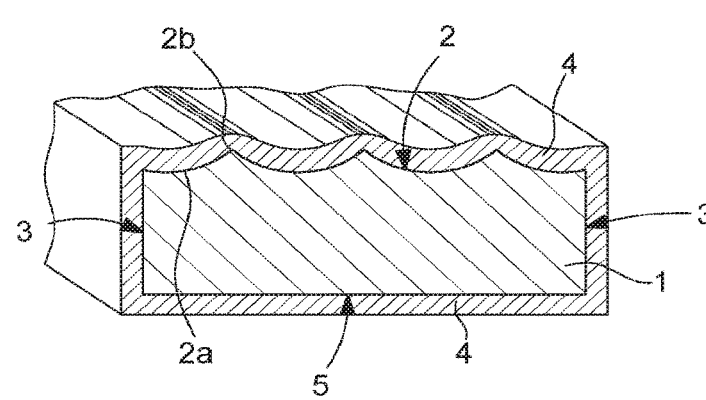
FIGS. 1A and 1B schematically represent sectional and perspective views of a component, in this case a pallet stone, having on the surface thereof intended to be in contact with another component, a scalloped texture according to the invention. In the manufactured state represented in FIG. 1A, the surface intended to be in contact with another component is completely coated with an electrically conductive layer. After wear, as schematically represented in FIG. 1B, the conductive layer remains only in the troughs of the texture.
Figure 1B:
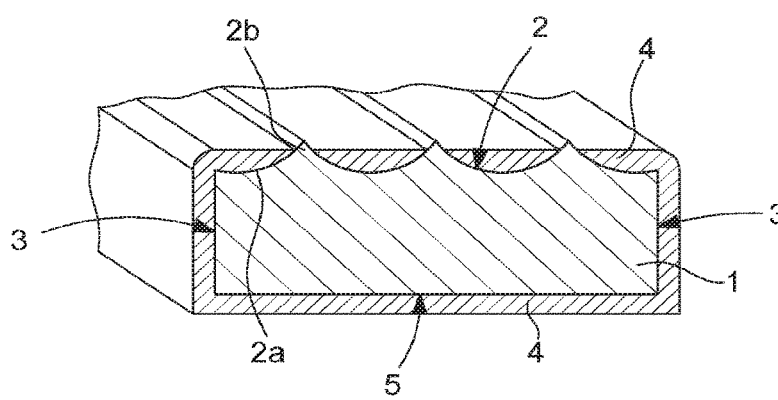

As schematically represented in FIGS. 1A-1B, component 1 has on its functional surface 2, i.e. on the surface thereof intended to be subjected to friction, a texture formed of a series of troughs 2a, preferably forming a periodic pattern. These troughs or recessed portions 2a extend between two side surfaces 3 surrounding functional surface 2. In the illustrated example, the troughs extend between two side surfaces which are parallel. Preferably, the structure of surface 2 is formed of periodic scallops with troughs 2a of rounded cross section separated by peaks 2b. This structure has the advantage of being able to be produced directly when the edge of the component is machined/etched in the DRIE process. According to this variant, the contact between component 1 and the surface of the component against which it is intended to rub, occurs on peaks 2b of the structure of surface 2 and troughs 21 extend in the direction of the friction produced between the two components. Generally, the troughs can have different shaped cross-sections (triangular, square, etc.). Likewise, portions 2b surrounding troughs 2a may be flat rather than in relief. Typically, the depth P of the troughs, which is the distance between the lowest point and the highest point of the texture, is comprised between 100 and 500 nm. Further, the troughs can extend in parallel, perpendicularly or in an inclined manner with respect to the direction of friction of component 1 against which it is intended to rub.

According to the invention, the entire component is preferably coated with an electrically conductive layer 4 at the end of its manufacturing process. Thus, as illustrated in FIG. 1A, functional surface 2 and all of side surfaces 3 and back surface 5 are entirely coated with an electrically conductive layer 4 at the end of the manufacturing process. The thickness of the substantially constant layer 4 is consistent, that is to say that layer 4 follows the surface topology of the component and particularly of functional surface 2. Next, during use, following wear due to friction, conductive layer 4 will gradually disappear from peak portions 2b which are on either side of troughs 2a (FIG. 1B), while the portions of the conductive layer lying between peaks 2b, or only in the bottom of troughs 2a, remain present and continue to ensure the conductivity required, for example, to evacuate any accumulated electrostatic charges. In a variant, it is also possible to envisage that not every surface is completely coated with the conductive layer, provided that the latter is in one piece over the entire component. Thus, it is possible to envisage that, on the functional surface, only troughs 2a are coated with conductive layer 4 at the end of the manufacturing process.

Figure 2A:
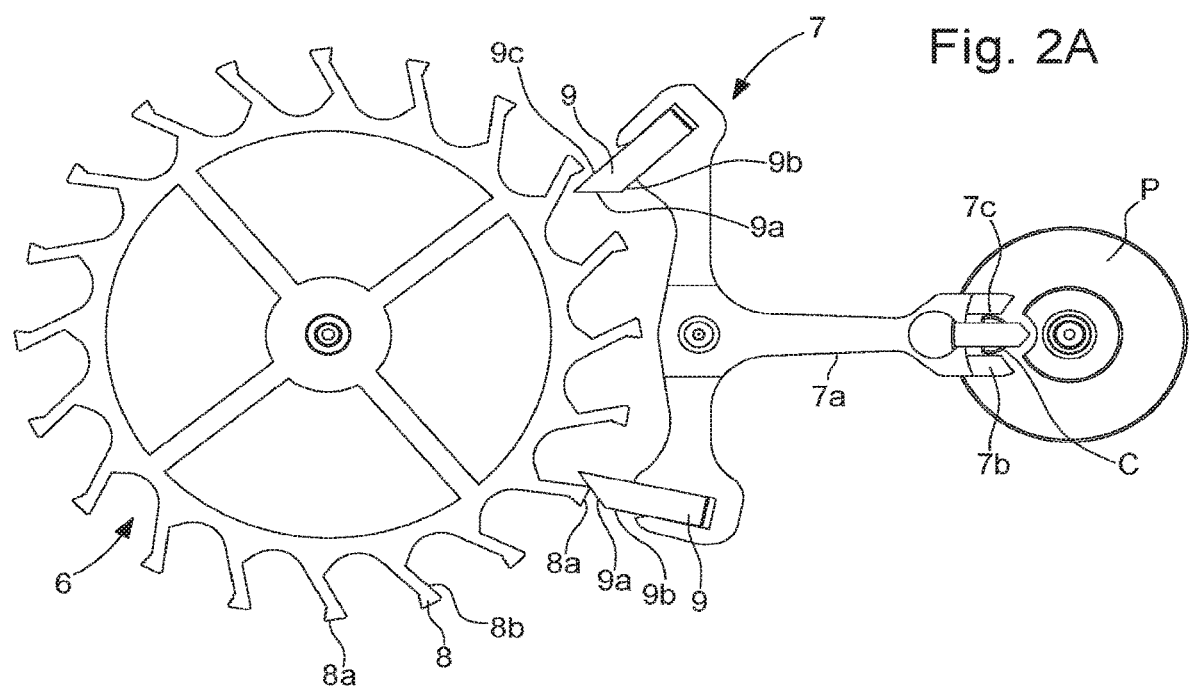
FIG. 2A is a representation of a timepiece system comprising two components (escapement wheel/pallets) which, on the edge of the teeth and/or of the pallets, have a texture according to the invention with the electrically conductive layer present in the troughs.
Figure 2B:
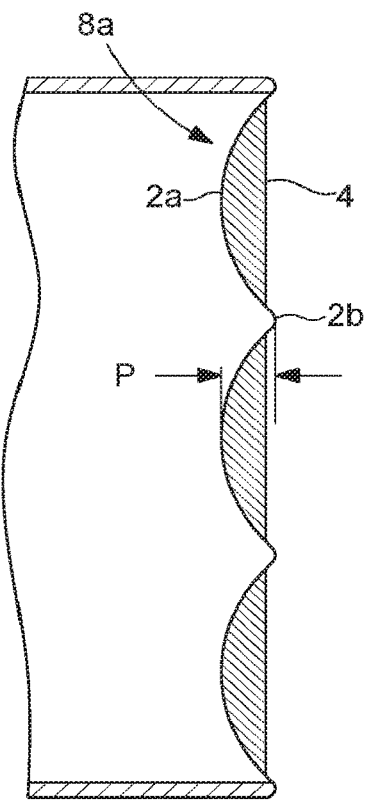
FIG. 2B schematically represents the texture on the machined edge of one of the two components with the conductive layer in the troughs.

By way of illustration, FIG. 2A represents a timepiece system comprising an escape wheel 6 having teeth 8 and a pallet lever 7 comprising two pallet stones 9. Teeth 8 and escape wheel 6 each have an impulse face 8a and a locking face 8b and the pallet stones 9 of pallet lever 7 each have an impulse face 9a and a locking face 9b and a surface 9c called the back of the pallet stone. Pallet lever 7 further includes a lever 7a ending in a fork comprising two horns 7b, whose faces 7c which are opposite each other cooperate with an impulse pin C carried by a roller P integral with the balance (not represented). In the illustrated example, impulse faces 8a, 9a and locking faces 8b, 9b respectively of teeth 8 and of pallet stones 9, which are subjected to friction, have a texture according to the invention with conductive layer 4 in troughs 2a (FIG. 2B). It is evident that in variants, at least one of the surfaces of impulse faces 9a and 9a and locking faces 8b and 9b respectively of the teeth or of the pallet stones has a texture according to the invention with conductive layer 4 in troughs 2a. It could also be envisaged, in a variant, that the functional surface according to the invention forms surfaces 7c of the horns of the pallet fork intended to come into contact with impulse pin C.

In the case of a balance spring more specifically intended to be fitted to a balance with fixed inertia (not represented), both faces of the outer coil of the balance spring are perpendicular to the plane of the balance spring and respectively subjected to friction against the two pins of the index assembly during the oscillation of the balance/balance spring. Consequently, at least one of these two faces may have a surface with the texture formed of a series of troughs 2a separated by peaks 2b coated with conductive layer 4 according to the invention, the lines of the peaks extending in the circumferential direction of the balance spring coils.

Figure 3:
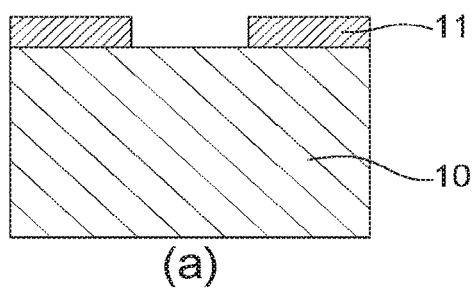
FIG. 3 schematically illustrates, in a known manner, the various steps of the DRIE process implemented to produce the texture according to the invention.
Figure 3:
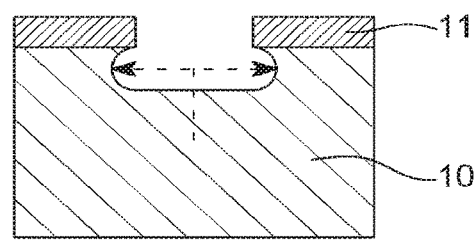
Figure 3:
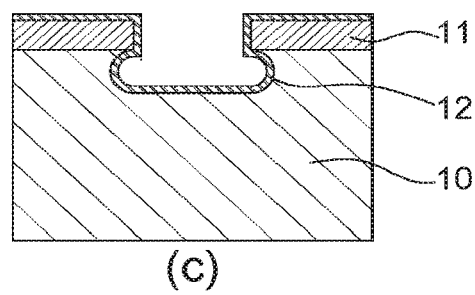
Figure 3:
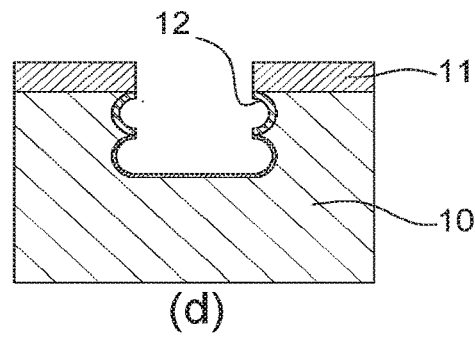

Various processes can be envisaged to form the structure according to the invention. For example, it can be obtained by machining, selective chemical etching, etc. Preferably, this surface texture is obtained during the machining of the component by the DRIE process which is plasma etching process which has two different successive cycles, namely an etching cycle and a passivation cycle. The method is schematically represented in FIG. 3. In a known manner, a silicon-based blank 10, for example, is provided. A perforated mask 11 defining the trench to be machined is formed on the surface of blank 10 (FIG. 3a). The method then consists of the succession of steps of etching (FIG. 3b) in a fluorinated gas (e.g. $SF_6$) and of passivation (layer 12) in a fluorocarbon gas (e.g. $C_4F_8$), wherein the alternate etching and passivation steps produce the scalloped structure on the machined sidewall. The periodicity and depth of the troughs can, in a known manner, be adjusted by changing, amongst other things, the etching and passivation sequence times.

Once the texture according to the invention is obtained on the functional surface, the conductive layer is deposited on the various surfaces of the component. Preferably, this layer is metal and formed of a corrosion resistant and non-magnetic metal such as gold, platinum, rhodium, palladium, chromium, titanium, vanadium, etc. Typically, this layer has a thickness less than or equal to 100 nm. The conductive layer is deposited by means of various known processes, such as sputtering, physical vapour deposition, ion implantation or electrolytic deposition.

It will be noted that, in addition to the conductive layer, the component may be coated with one or more layers underneath the conductive layer. For example, in the case of a silicon balance spring, this may be a temperature compensation layer, for example of $SiO_2$, which has the function of compensating for variations in the thermoelastic coefficient of the balance spring core with temperature.

KEY (1) Component
(2) Functional surface of the component
   a. Trough
   b. Peak or portion
(3) Side surface, or surface communicating with the functional surface
(4) Electrically conductive layer
(5) Surface not communicating with the functional surface, or surface opposite the functional surface
(6) Escape wheel
(7) Pallet-lever
   a. Lever
   b. Horns
   c. Functional surface of the horns
(8) Escape wheel tooth
   a. Impulse face forming a functional surface
   b. Locking face forming a functional surface
(9) Pallet stone
   a. Impulse face forming a functional surface
   b. Locking face forming a functional surface
   c. Back of the pallet stones
(10) Blank
(11) Mask
(12) Passivation layer
   C: Impulse pin
   P: Roller

The invention claimed is:

1. A component intended to be in friction contact with another component, said component being coated with an electrically conductive layer in one piece at least partially covering every surface of the component, the friction occurring on at least one of these surfaces, called the functional surface, said functional surface being surrounded b a plurality of side surfaces, the component having on its functional surface a texture formed of peaks separated by a series of troughs coated with said electrically conductive layer, said troughs each extending between two side surfaces of the component, wherein, at an end of manufacturing the component, the electronically conductive layer is configured such that the troughs of the texture are coated with the electrically conductive layer and the peaks are not coated and the electrically conductive layer remains in one piece over the entire component despite wear caused by friction on the functional surface.

2. The component according to claim 1, wherein said troughs have a depth P which is comprised between 100 and 500 nm.

3. The component according to claim 1, wherein the series of troughs forms a periodic structure.

4. The component according to claim 2, wherein the troughs have a rounded cross-section and are separated by the peaks in relief, thereby forming a scalloped texture.

5. The component according to claim 1, Wherein the texture is present on one side of said at least one component machined by deep reactive ion etching.

6. The component according to claim 1, wherein the electrically conductive layer is a metal layer.

7. The component according to claim 6, wherein the metal layer is made of a metal chosen from among gold, platinum, rhodium and palladium.

8. The component according to claim 1, wherein the component is a timepiece component.

9. The component according to claim 8, wherein the component is a balance spring intended to be fitted to a balance with fixed inertia.

10. The component according to claim 8, Wherein the component is a component of one of the following systems: escape wheel, pallets roller.

11. The component according to claim 10, wherein the functional surface forms an impulse face and/or locking face of escape Wheel teeth.

12. The component according to claim 10, wherein the functional surface forms an impulse face and/or locking face of pallet stones.

13. The component according to claim 10, wherein the functional surface forms a surface of horns of a pallet fork intended to come into contact with an impulse pin.

14. The component according to claim 1, wherein said component is silicon-based.

15. A timepiece comprising a component intended to be in friction contact with another component, said component being coated with an electrically conductive layer in one piece at least partially covering every surface of the component, the friction occurring on at least one of these surfaces, called the functional surface, said functional surface being surrounded by a plurality of side surfaces, the component having on its functional surface a texture formed of peaks separated by a series of troughs coated with said electrically conductive layer, said troughs each extending between two side surfaces of the component, wherein, at an end of manufacturing the component, the electronically conductive layer is configured such that the troughs of the texture are coated with the electrically conductive layer and the peaks are not coated such that the electrically conductive layer remains in one piece over the entire component despite wear caused by friction on the functional surface.

16. A method for manufacturing a component, wherein the method comprises the following steps:
   (a) providing a blank,
   (b) machining a side on said blank, by a deep reactive ion etching process to produce the component, said machined side having a scalloped texture inherent to the deep reactive ion etching process, said texture defining on the machined side peaks separated by a set of troughs,
   (c) depositing an electrically conductive layer on each of the surfaces of the component including in the troughs, wherein at an end of the depositing, the peaks are not coated by the electrically conductive layer.

* * * * *